(12) United States Patent
Banfield et al.

(10) Patent No.: US 10,382,037 B2
(45) Date of Patent: Aug. 13, 2019

(54) MODULAR CAPACITIVE TOUCH SWITCH SYSTEM

(71) Applicant: ILLINOIS TOOL WORKS INC., Glenview, IL (US)

(72) Inventors: Mark Banfield, Wimborne (GB); Alan Capaldi-Tallon, Portsmouth (GB); Christopher Foster, Southampton (GB)

(73) Assignee: Illinois Tool Works Inc., Glenview, IL (US)

( * ) Notice: Subject to any disclaimer, the term of this patent is extended or adjusted under 35 U.S.C. 154(b) by 161 days.

(21) Appl. No.: 15/306,508

(22) PCT Filed: Mar. 31, 2015

(86) PCT No.: PCT/US2015/023503
§ 371 (c)(1),
(2) Date: Oct. 25, 2016

(87) PCT Pub. No.: WO2015/167734
PCT Pub. Date: Nov. 5, 2015

(65) Prior Publication Data
US 2017/0047929 A1    Feb. 16, 2017

Related U.S. Application Data

(60) Provisional application No. 61/987,833, filed on May 2, 2014.

(51) Int. Cl.
*H03K 17/96* (2006.01)

(52) U.S. Cl.
CPC . *H03K 17/962* (2013.01); *H03K 2217/96079* (2013.01); *H03K 2217/960755* (2013.01)

(58) Field of Classification Search
CPC ..... H03K 17/962; H03K 2217/960755; H03K 2217/96079
See application file for complete search history.

(56) References Cited

U.S. PATENT DOCUMENTS

| 8,203,466 | B2 | 6/2012 | Rudd et al. |
| 2011/0057773 | A1 | 3/2011 | Newman et al. |
| 2014/0036428 | A1 | 2/2014 | Leong et al. |

FOREIGN PATENT DOCUMENTS

| EP | 2045923 A1 | 4/2009 |
| JP | 2001057126 A | 2/2001 |
| JP | 2013105739 A | 5/2013 |
| KR | 1020100082082 A | 7/2010 |
| WO | 2009054592 A1 | 4/2009 |
| WO | 2013058708 A1 | 4/2013 |

OTHER PUBLICATIONS

ISR and WO for PCT/US2015/023503 dated Jan. 22, 2016.

*Primary Examiner* — Shaheda A Abdin
(74) *Attorney, Agent, or Firm* — Boyle Fredrickson, S.C.

(57) ABSTRACT

A modular capacitive sensing switch provides a separate circuit module attachable to a variety of electrode modules, the latter having different configurations. Embodiments providing adhesive mounting and network connections allow simple configuration of a wide variety of capacitive touch panel systems.

17 Claims, 4 Drawing Sheets

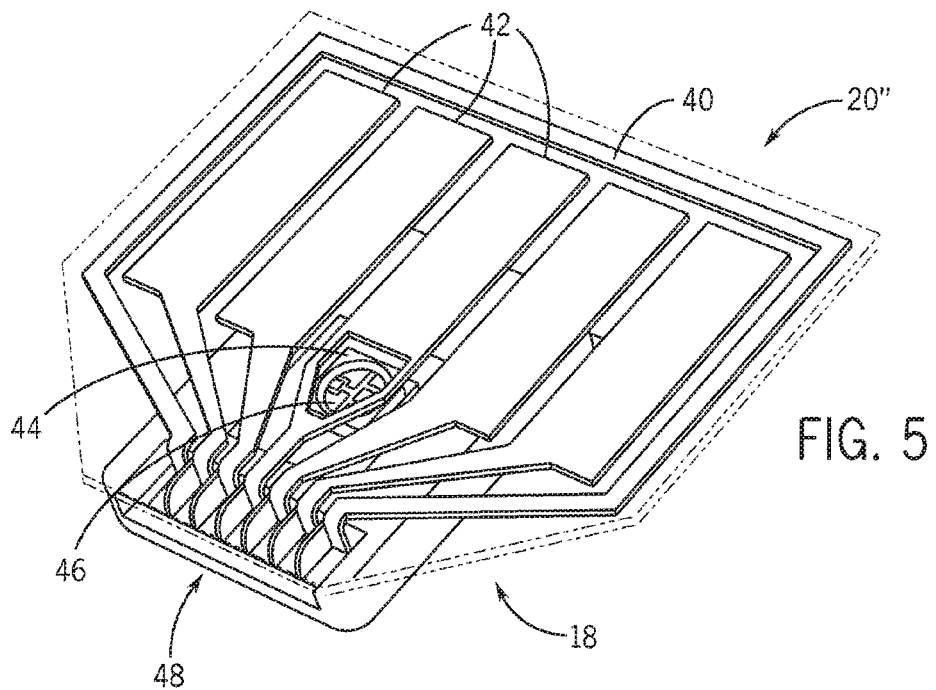
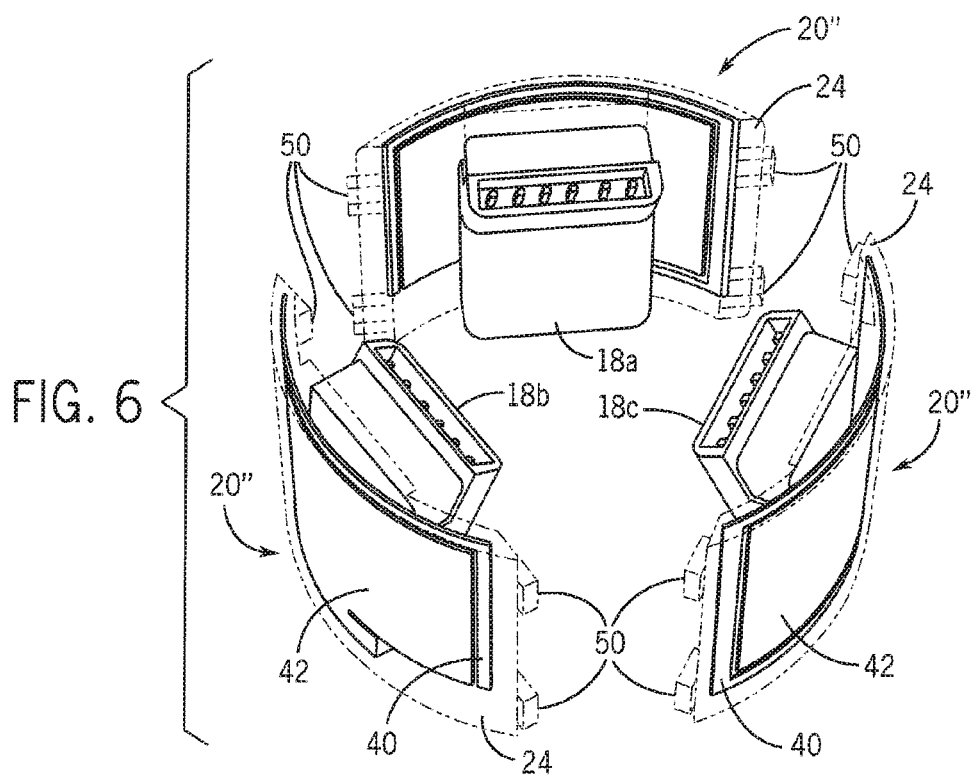

MODULAR CAPACITIVE TOUCH SWITCH SYSTEM

CROSS-REFERENCE TO RELATED APPLICATIONS

This application is National Phase of International Application No. PCT/US2015/023503, filed Mar. 31, 2015, and claims the benefit of U.S. provisional application 61/987,833 filed May 2, 2014, and hereby incorporated by reference.

FIELD OF THE INVENTION

The present invention relates to capacitive touch switches and in particular to a modular capacitive touch system that simplifies the implementation of capacitive touch switching in a wide variety of applications.

BACKGROUND OF THE INVENTION

Capacitive touch switches sense a change in electrical capacitance at electrodes, for example, when approached by a human finger, and use that sensing to generate an electrical switch signal.

Unlike conventional mechanical switches with movable contacts, including membrane switches, capacitive touch switches have no moving parts and are particularly well-suited to applications where there is mechanical shock and long life is required. Because capacitive sensing operates over a distance, capacitive touch switches can be easily sealed from environmental contaminants such as dirt or water by a protective barrier. In particular, capacitive touch switches may be placed behind a panel, for example, of nonconductive plastic or glass, to provide an unbroken, attractive surface resistant to damage.

Incorporating capacitive touch switches into a product normally requires a significant amount of custom engineering to develop the sensing electrode array, the necessary mounting structure for the sensing array and the layout of the electronic circuit which is desirably positioned close to the electrodes for maximum sensitivity. The cost of this effort can be an obstacle to the adoption of capacitive touch switch systems. Because the electrodes are normally tightly integrated with the sensing surface, it can be difficult to repair or rework a capacitive touch switch.

SUMMARY OF THE INVENTION

The present invention provides a modular capacitive touch switch system having a circuit module that may be mechanically and electrically attached to various different standardized electrode arrays, for example, with the electrode arrays integrated with supporting structure. For many applications, the circuit module and a selected standard electrode array may be simply assembled and adhered to the back of the panel to provide capacitive touch sensing. The circuit module may include network communication circuitry allowing the modular capacitive touch switches to be readily interconnected. In the event of switch failure, individual components, either the circuit module or the electrode array, can be individually replaced.

In one embodiment, the invention provides a modular capacitive touch sensor having a housing and separate electrode support. The housing holds a capacitive sensing circuit, a network communication circuit communicating with the capacitive sensing circuit, a first releasable electrical connector portion communicating with the capacitive sensing circuit and a second releasable electrical connector portion communicating with the network communication circuit. The housing also has a front face supporting a first releasable mechanical interconnection portion.

The electrode support has a second releasable mechanical interconnection portion releasably engaging with the first releasable mechanical interconnection portion at an interface. The electrode support also holds an electrically conductive electrode on a front face of electrode support and a third releasable electrical connector portion communicating with the electrode and engaging the first releasable electrical connection when the electrode support is attached to the housing.

It is thus a feature of at least one embodiment of the invention to simplify the integration of capacitive sensing into products by allowing standardization of a circuit module to be used with a variety of different electrode modules.

The electrode may be substantially planar.

It is thus a feature of at least one embodiment of the invention to provide a system that can provide common capacitive switch systems that work, for example, behind a flat-panel.

The first surface has a width of less than 19 millimeters.

It is thus a feature of at least one embodiment of the invention to provide a system that can implement a multikey keyboard.

The front face of the housing may be opposite the interface between the electrode support and the housing.

It is thus a feature of at least one embodiment of the invention to provide a compact system adaptable to a wide variety of sensing environments.

The housing may hold an LED at the front face of the housing and exposed through the electrode support and electrode through the first surface of the electrode support.

It is thus a feature of at least one embodiment of the invention to provide a capacitive switch system that offers visual feedback of a touch.

The LED may be a three-color LED.

It is thus a feature of at least one embodiment of the invention to provide a capacitive switch that can adapt not only to different environments but to different desired visual appearances.

The housing may hold a ring-shaped light pipe receiving light from the LED to create a halo of illumination around the electrode exposed through the electrode support and electrode through the first surface of the electrode support.

It is thus a feature of at least one embodiment of the invention to provide a display system that does not decrease capacitive sensitivity at the intuitive center strike position of a user's touch. By encircling the electrode, sensitivity may be intact at this center region.

The electrode support may include a pressure sensitive adhesive on the first face of the electrode support for attaching the electrode support to a sensing surface.

It is thus a feature of at least one embodiment of the invention to provide a capacitive switch element that may be easily integrated into a product and that permits rework or replacement of the electrode assembly by removal of the adhesive attachment and replacement with a new electrode.

The housing may further include a fourth releasable electrical connector communicating with the third releasable electrical connector to receive an ancillary electrical connector without obstructing attachment of the first surface to a planar sensing surface.

It is thus a feature of at least one embodiment of the invention to allow the circuit module to be used with other electrode designs that may be attached to the module electrically but not physically.

The first releasable electrical connector receives a corresponding connector at an insertion axis canted with respect to the first surface It is thus a feature of at least one embodiment of the invention to provide a connector system that is not obstructed by the panel surface to which the touch sensor system is attached while preserving a low harness profile.

The electrode may be substantially a portion of the cylinder.

It is thus a feature of at least one embodiment of the invention to permit capacitive switch systems to be used in unusual, nonplanar touch panel situations.

The electrode may provide a grid of conductors defining regular openings therethrough.

It is thus a feature of at least one embodiment of the invention to provide a semitransparent electrode, for example, allowing backlighting in dim environments.

The electrode support may include multiple electrically separate electrodes each communicating independently through the third releasable electrical connector with the first releasable connector.

It is thus a feature of at least one embodiment of the invention to provide a modular system that may share electronic subassemblies with multiple capacitive switches.

The electrode support may conform to at least a portion of the circle and the electrodes may be sectors fitting within that portion of the circle.

It is thus a feature of at least one embodiment of the invention to provide a modular system that may implement a versatile pie segment switch array.

The network circuit may provide for a daisy chain connection with network circuits of other modular capacitive touch sensing systems.

It is thus a feature of at least one embodiment of the invention to permit simplified wiring of multiple switches together without bulky wire harnesses.

The first releasable interconnection portion and second releasable interconnection portion may engage by a sliding action substantially parallel to the first surface.

It is thus a feature of at least one embodiment of the invention to provide an inter-engagement of the components of the sensor system that can be performed in a narrow space behind a user panel.

The capacitive sensing circuit may include a calibration value storage memory communicating with the network communication circuit to receive a calibration value therefrom, the calibration value determining a capacitive sensing switch point for the change in capacitance of the electrode.

It is thus a feature of at least one embodiment of the invention to permit standardization in the electrical components of a capacitive switch that can nevertheless accommodate electrical variations in different electrode configurations.

Other features and advantages of the invention will become apparent to those skilled in the art upon review of the following detailed description, claims and drawings in which like numerals are used to designate like features.

BRIEF DESCRIPTION OF THE DRAWINGS

FIG. 5 is a figure similar to that of FIG. 4 showing multiple touch-discrimination electrode elements arrayed in a line;

FIG. 6 is a perspective view of three circuit modules and an attached curved electrode array together providing capacitive sensing on a curved surface;

Figure 1:
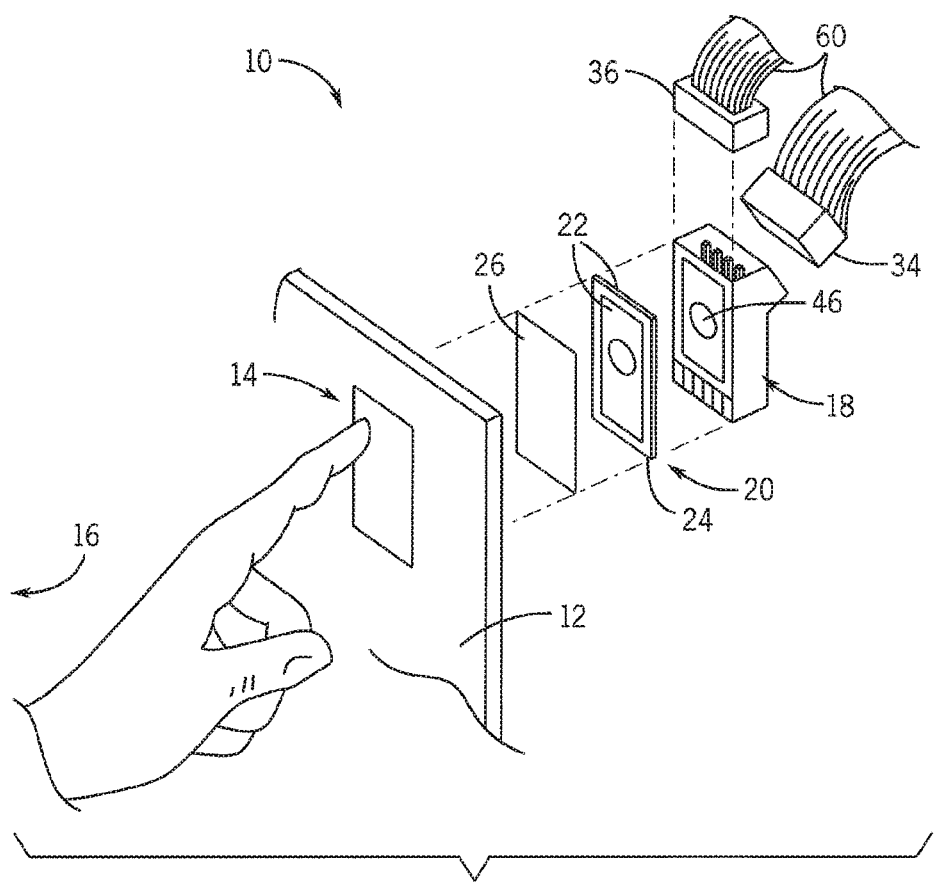
FIG. 1 is an exploded diagram of a simple modular capacitive touch switch system implemented with the present invention showing a circuit module attached to a standard electrode array, the latter adhered to the back of a protective panel with an adhesive layer.

Before the embodiments of the invention are explained in detail, it is to be understood that the invention is not limited in its application to the details of construction and the arrangement of the components set forth in the following description or illustrated in the drawings. The invention is capable of other embodiments and of being practiced or being carried out in various ways. Also, it is to be understood that the phraseology and terminology used herein are for the purpose of description and should not be regarded as limiting. The use of "including" and "comprising" and variations thereof is meant to encompass the items listed thereafter and equivalents thereof as well as additional items and equivalents thereof.

DETAILED DESCRIPTION OF THE PREFERRED EMBODIMENTS

Referring now to FIG. 1, a modular capacitive touch switch 10 may operate behind a transparent insulating panel 12, for example, as a polycarbonate or glass sheet optionally having a printed graphic 14 on a front or rear surface of the panel 12 denoting a touch target to a user 16 that defines a touch point for activation of the modular capacitive touch switch 10.

The modular capacitive touch switch 10 may be positioned behind the panel 12 and may include a circuit module 18 that may be releasably attached, electrically and mechanically, at a rear surface to any of a number of standard electrode arrays 20, the latter providing conductive electrodes 22 held by a supporting framework 24. The supporting framework 24 may, for example, be an injection molded polymer adhered to or insert molded around the conductive electrodes 22.

The front surface of the electrode array 20 may be attached by an adhesive layer 26 or other adhesive to the rear surface of the panel 12 so as to be in alignment with the printed graphic 14. The adhesive surface of the adhesive layer 26, before attachment to the panel 12, may be protected by a release liner (not shown) as is understood in the art which may be peeled away to expose the adhesive surface.

Figure 2:
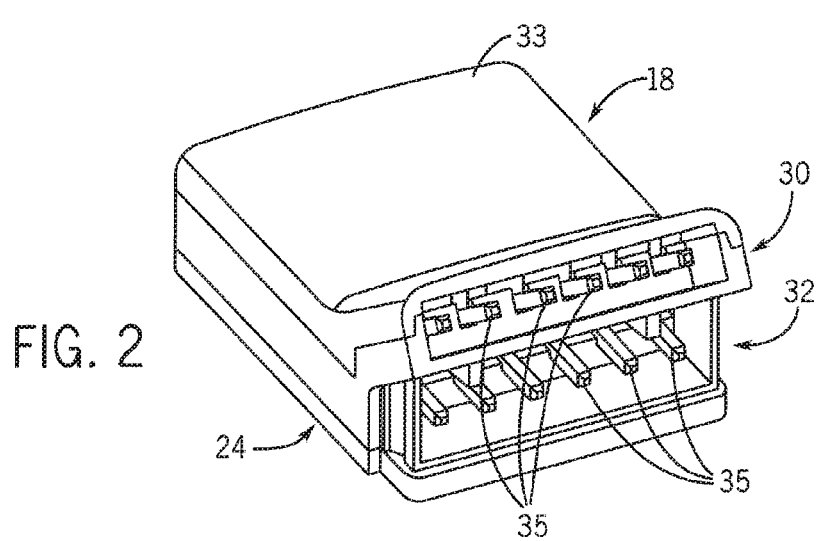
FIG. 2 is a perspective view of the upper end of the circuit module showing connector pins for attachment of the circuit module to harnesses for the receipt of power and the exchange of data with other devices.

Referring also to FIG. 2, the circuit module 18 may provide for first and second electrical connectors 30 and 32 providing multiple pins 35 extending from connector shells integrated to the housing 33 of the circuit module 18. These electrical connectors 30 and 32 may attach to corresponding releasably attachable electrical connectors 34 and 36 to provide for power and data communication between the circuit module 18 and external circuits as will be discussed. Electrical connector 30 may have its insertion axis tipped with respect to the surface of the electrode array 20 (and thus with respect to the rear surface of the panel 12) while electrical connector 32 may have its insertion axis parallel to that plane so as to prevent interference between the connectors 34 and 36.

Figure 3:
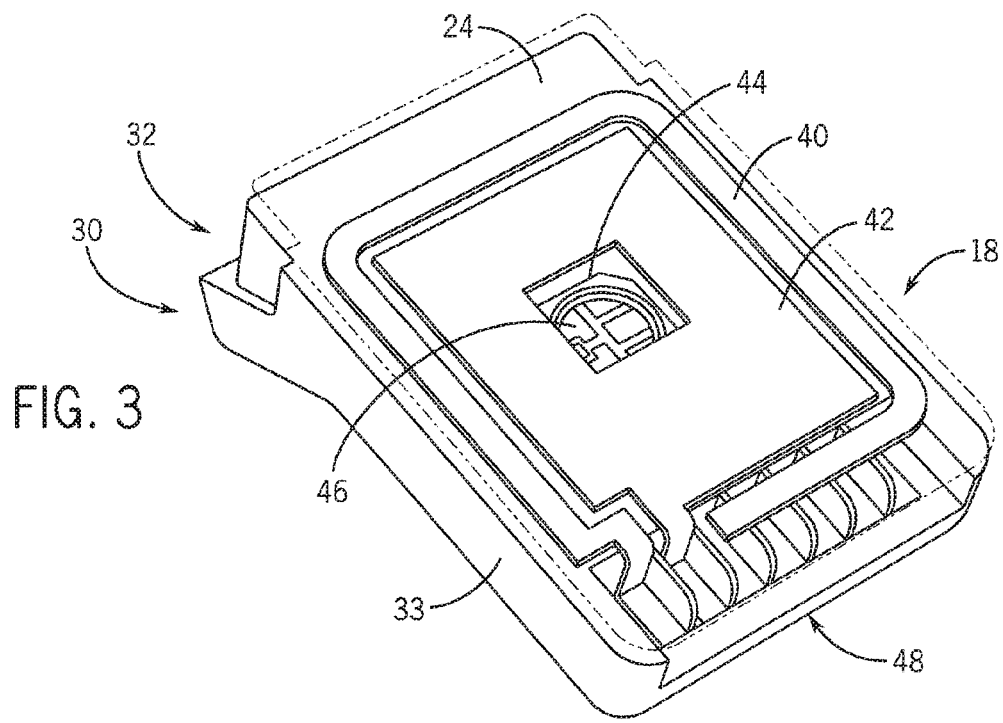
FIG. 3 is a perspective view of the front surface of the standard electrode array as mechanically and electrically attached to the circuit module prior to installation on the panel.

Referring now to FIGS. 2 and 3, the supporting framework 24 of the electrode array 20 may provide any of snaps, detents, tabs, hooks or the like (not shown) to releasably, mechanically attach and retain it to the lower surface of the housing 33 of the electronics module 18. In one embodiment, the conductive electrodes 22 may present a peripheral ring reference electrode 40 positioned around a central sensing electrode 42, the latter of which may be formed in a grid and have a central aperture 44 to permit the passage of light from a multicolor LED 46 held in the electronic module 18 as exposed from its bottom surface.

The conductive electrodes 22 may releasably attach to circuitry within the electronic module 18 (not shown) through an electrode connector assembly 48, at an opposite end of the electronic module 18 from the connectors 32 and 30. The reference electrode 40 and central sensing electrode 42 may be received by the electrode connector assembly 48 through electrically separate contacts. As is understood in the art, the capacitance between the central sensing electrode 42 and reference electrode 40 will be sensitive to the presence of a user's finger or the like proximate to the conductive electrodes 22. Activation of the modular capacitive touch switch 10 is provided by detection of a change in capacitance. This detection may be signaled to the user by the LED 46 turning the LED on or off or changing its color and may be transmitted over a network connection as will be discussed below.

Figure 4:
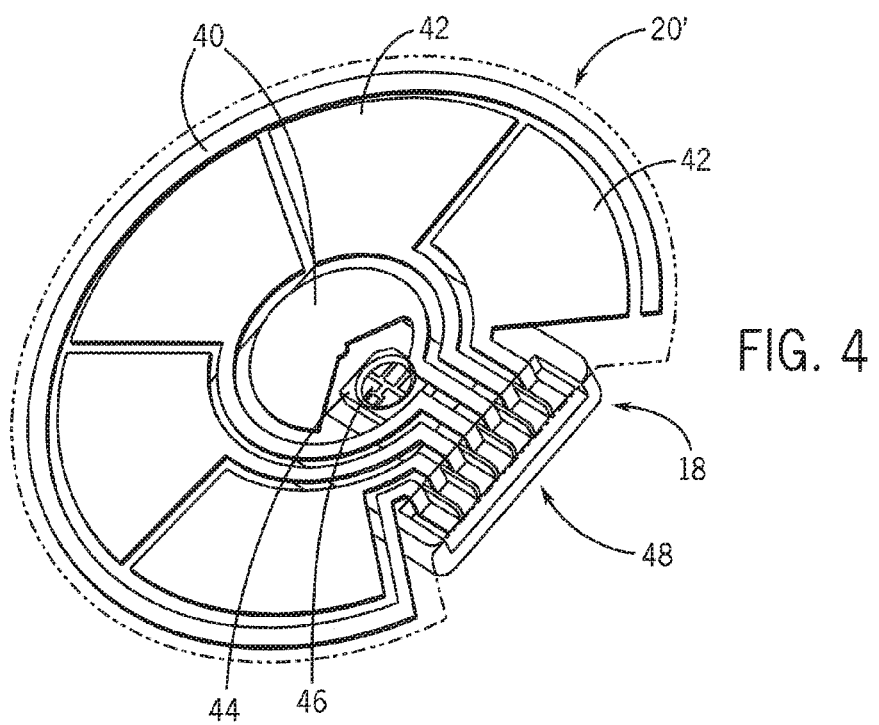
FIG. 4 is a figure similar to that of FIG. 3 showing an alternative standard electrode array having multiple separate touch-discriminating electrode elements arrayed in a ring.

Referring now to FIG. 4, in an alternative embodiment, the electrode connector assembly 48 may receive signals simultaneously for multiple connections, for example, from different sensing electrodes 42 of a pie segment electrode array 20' providing five arcuate annular sectors comprising different sensing electrodes 42 arranged in a ring about a common central reference electrode 40 and within circumscribing circular reference electrode 40'. Each of the different sensing electrodes 42 and reference electrodes 40 may be separately terminated in electrode connector assembly 48 to provide separate touch sensitive regions. An aperture 44 is provided within the central reference electrode 40 aligned with the LED 46 to communicate light therethrough.

Referring now to FIG. 5, in an alternative embodiment the electrode connector assembly 48 may receive multiple connections of a linear connector array providing for five rectangular sensing electrodes 42 arranged along an axis within a circumscribing reference electrode 40. The electrode connector assembly 48 receives separate connections to each of the sensing electrodes 42 and the reference electrode 40. As before, an aperture 44 is provided within the electrode array 22' aligned with the LED 46 to communicate light therethrough.

Referring now to FIG. 6, the electrode array 20 may alternatively have a non-planar supporting framework 24, for example, conforming to the inner surface of a cylindrical panel 12 (not shown). In this case, each sensing electrode 42 conforms to a sector of a cylinder and is surrounded by an equally conforming reference electrode 40. The supporting framework 24 may include interconnecting tabs 50 allowing connections for other supporting framework 24 with different electronic modules 18 to form a mechanically integrated switch array.

Figure 7:
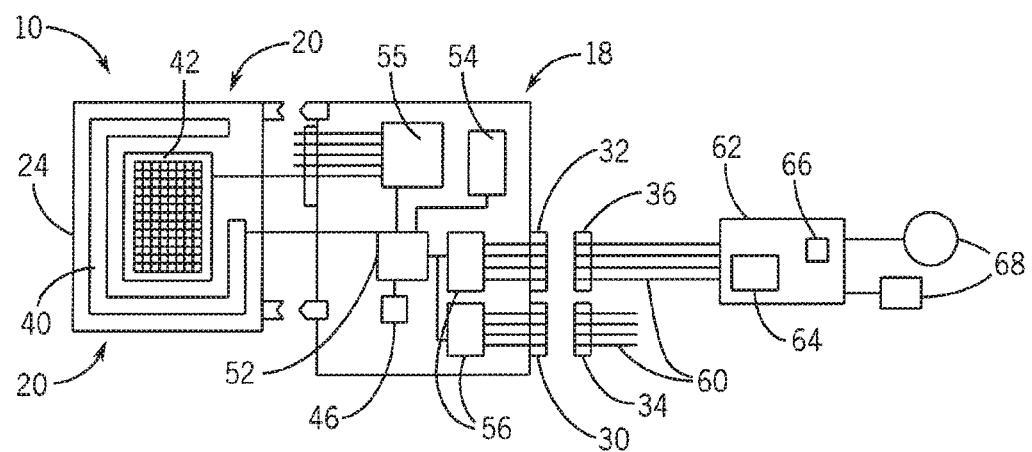
FIG. 7 is a simplified block diagram of the circuit module and standard electrode array of FIG. 3.

Referring now to FIG. 7, in one embodiment, electronic module 18 may provide for a microcontroller 52 communicating with electronic memory 54 to execute a stored program, for example, "personalizing" the electronic module 18 for the particular electrode array 20 to be employed with it including adjustment of switching thresholds, control of the logic of the activation of the LED 46 (also communicating with the microcontroller 52) and setting the number and logic of the switch surfaces to be implemented by the electrode array 20. In one non-limiting example, the reference electrode 40 may be driven by a high-frequency signal from the microcontroller 52, and capacitive coupling to the sensing electrode 42 from the reference electrode 40 may be detected by a sensor circuit 55 to detect a touch or the like that may be communicated to the microcontroller 52. One technique is described in U.S. Pat. No. 8,203,466 assigned to the assignee of the present invention and hereby incorporated by reference.

Microcontroller 52 may also communicate with serial or parallel communication modules 56 that may communicate via harnesses 60, for example, with a central controller 62 using the capacitive touch switch 10 as an input and providing electrical power to the capacitive touch switch 10. The controller 62 may, for example, be an appliance controller having an electronic computer 64 executing a stored program held in memory 66 to control or read various appliance actuators and sensors 68 according to user input signals received through the capacitive touch switch 10.

The personality of the circuit module 18 may be adjusted by programming of the memory 54 allowing the same hardware to be used for a wide variety of different purposes and different sensing electrode arrays 20.

A memory 54 may be assigned a unique address for communication with other electronic modules 18 or with the central controller 62, these components being connected in a daisy chain fashion for serial communication with the controller 62 to reduce harness wiring costs. The addresses may be automatically allocated by the modules 18 operating among themselves or pre-programmed.

A calibration value may be stored in the electronic memory 54 defining a threshold of capacitance which will be considered a switching "touch" event. This value may change according to the particular type of sensing electrode 42 and reference electrode 40 used and thus may be downloaded over the network connection through connector 32 to the electronic module 18 to allow the electronic module 18 to be used with any electrode configuration. Alternatively or in addition, the supporting framework 24 may include switch elements (for example, shorting connections across electrode connector assembly 48) or other indicating features that allow this calibration value to be derived from the particular supporting framework 24 connected to the electronic module 18 after the supporting framework 24 and its associated electrodes are attached. The occurrence of the touch is then transmitted over the network connection through connector 32 to control other devices, for example, in the manner of a conventional electrical keypad having mechanical contacts or the like.

By providing a single electronic module 18 and multiple standard or custom electrode arrays 20, a wide variety of different applications can be implemented at low cost. Importantly, an electronic module 18 of a single common design may be manufactured in large quantities to be used with different electrode arrays 20 thereby significantly reducing the cost of the electronic module 18. The ability to separate the electrode array 20 and electronic module 18 provides increased design flexibility accommodating design changes or upgrades to the electrode arrays 20 even relatively late in the design process.

During manufacture, electrode arrays 20 may be installed on a panel and then the electronic modules 18 attached to them in separate manufacturing steps that accommodate the differences in manufacturing apparatus and environment necessary to mechanically attach the electrode arrays 20 as opposed to providing for the electrical attachment of the electronic module 18. A failing electronic module 18 may be readily "swapped out" improving repairability of the appliance.

It will be appreciated that the capacitive touch switch 10 may implement not only touch sensitivity but also gesture or slide sensitivity by monitoring a time change of capacitance through one or more central electrodes 42 or by measuring the relative capacitance between adjacent electrodes. A dust cap (not shown) may fit over any one of the connectors 30 or 32 that is not used to protect the connector and the housing 33 against the introduction of contaminants or the like.

Figure 8:
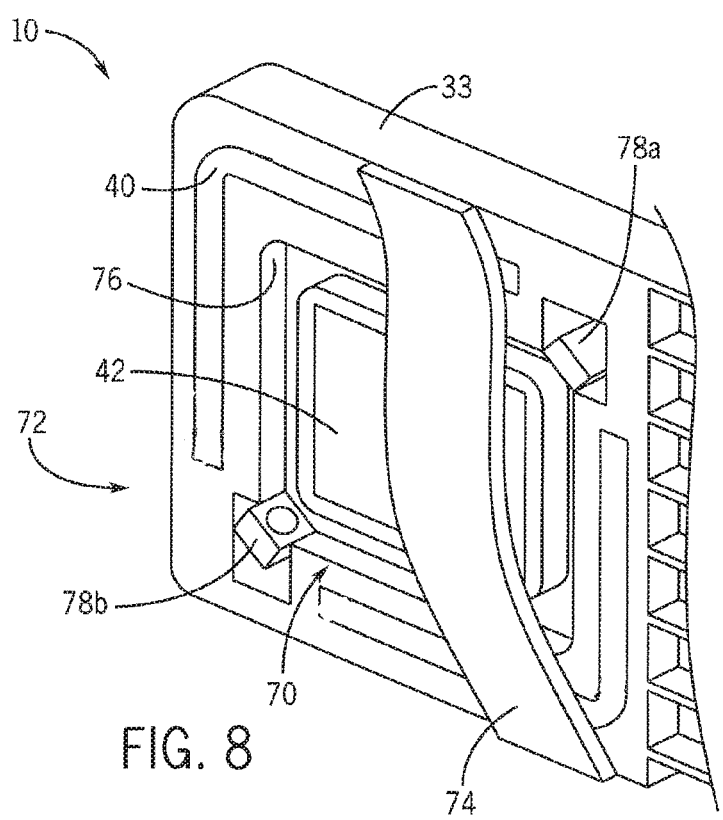
FIG. 8 is a figure similar to that of FIG. 3 showing a halo illumination style using a light pipe and diffuser system.

Referring now to FIG. 8, in an alternative embodiment, the supporting framework 24 may provide for an opening 70 surrounding the electrode 42 to allow passage of light from a halo illuminator 72 in the circuit module 18 to pass therethrough. The halo illuminator 72 avoids the need to place an opening in the center of the sensing electrode 42 and provides a clear indication of the entire area of the sensing electrode 42 not just its centerpoint. In one embodiment, the halo illuminator 72 is held within the housing 33 beneath a translucent diffuser 74 and comprises a loop-shaped light pipe 76 (shown in this embodiment as being substantially rectangular) expanded to hold two side-mounted LEDs 78a and 78b transmitting light in opposite directions through the light pipe 76 to be conducted by internal reflection along the length of the light pipe 76 with some emissions through the diffuser 74. The LEDs 78a and 78b may be placed at two opposite corners of the rectangular light pipe 76 and directed across a diagonal so that light from each LEDs 78 splits and passes in two directions from each LED 78 through the light pipe 76 providing more uniform illumination.

Various features of the invention are set forth in the following claims. It should be understood that the invention is not limited in its application to the details of construction and arrangements of the components set forth herein. The invention is capable of other embodiments and of being practiced or carried out in various ways. Variations and modifications of the foregoing are within the scope of the present invention. It also being understood that the invention disclosed and defined herein extends to all alternative combinations of two or more of the individual features mentioned or evident from the text and/or drawings. All of these different combinations constitute various alternative aspects of the present invention. The embodiments described herein explain the best modes known for practicing the invention and will enable others skilled in the art to utilize the invention.

What is claimed is:

1. A modular capacitive touch sensor system comprising:
   (a) a housing holding:
      (i) a capacitive sensing circuit measuring change in electrical capacitance in an attached electrode to create a touch event;
      (ii) a network communication circuit communicating with the capacitive sensing circuit using serial communication to communicate the touch event with remote devices according to device addresses;
      (iii) a first releasable electrical connector portion communicating with the capacitive sensing circuit; and
      (iv) a second releasable electrical connector portion communicating with the network communication circuit adapted to releasably connect to network conductors;
   wherein the housing further provides a front face supporting a first releasable mechanical interconnection portion; and
   (b) an electrode support providing a second releasable mechanical interconnection portion connecting releasably with the first releasable mechanical interconnection portion at an interface, the electrode support holding:
      (i) an electrically conductive electrode on a front face of electrode support to permit sensing of capacitance through a touch surface removed from the housing; and
      (ii) a third releasable electrical connector portion communicating with the electrode and engaging and releasably connectable to the first releasable electrical connection when the electrode support is attached to the housing so that the capacitive sensing circuit may detect changes in electrical capacitance in an attached electrode to create the touch event.

2. The modular capacitive touch sensor system of claim 1 wherein the electrode is substantially planar.

3. The modular capacitive touch sensor system of claim 2 wherein the front face of the electrode support has a width of less than 19 millimeters.

4. The modular capacitive touch sensor system of claim 1 wherein the front face of the housing is opposite the interface between electrode support and the housing.

5. The modular capacitive touch sensor system of claim 1 further including an LED held in the housing at the front face of the housing and exposed through the electrode support and electrode through the front face of the electrode support.

6. The modular capacitive touch sensor system of claim 5 wherein the LED is a three-color LED.

7. The modular capacitive touch sensor system of claim 5 wherein the housing further holds a ring-shaped light pipe receiving light from the LED to create a halo of illumination around the electrode exposed through the electrode support and electrode through the front face of the electrode support.

8. The modular capacitive touch sensor system of claim 1 wherein the electrode support includes a pressure sensitive adhesive on the first face of the electrode support for attaching the electrode support to a sensing surface.

9. The modular capacitive touch sensor system of claim 1 further including a fourth releasable electrical connector communicating with the third releasable electrical connector to receive an ancillary electrical connector without obstructing attachment of the front face of the electrode support to a planar sensing surface.

10. The modular capacitive touch sensor system of claim 1 wherein the first releasable electrical connector receives a corresponding connector at an insertion axis canted with respect to the front face of the electrode support.

11. The modular capacitive touch sensor system of claim 1 wherein the electrode is substantially a portion of a cylinder.

12. The modular capacitive touch sensor system of claim 1 wherein the electrode provides a grid of conductors defining regular openings therethrough.

13. The modular capacitive touch sensor system of claim 1 wherein the electrode support includes multiple electrically separate electrodes each communicating independently through the third releasable electrical connector with the first releasable connector.

14. The modular capacitive touch sensor system of claim 13 wherein the electrode support conforms to at least a portion of a circle and the electrodes are sectors fitting within that portion of the circle.

15. The modular capacitive touch sensor system of claim 1 wherein the network circuit provides for a daisy chain connection with network circuits of other modular capacitive touch sensing systems.

16. The modular capacitive touch sensor system of claim 1 wherein the first releasable mechanical interconnection portion and second releasable mechanical interconnection portion engage by a sliding action substantially parallel to the front face of the housing.

17. The modular capacitive touch sensor system of claim 1 wherein the capacitive sensing circuit includes a calibration value storage memory communicating with the network communication circuit to receive a calibration value therefrom, the calibration value determining a capacitive sensing switch point for change in capacitance of the electrode.

* * * * *